(12) United States Patent
Ginestet et al.

(10) Patent No.: US 12,421,746 B2
(45) Date of Patent: Sep. 23, 2025

(54) VARIABLE VOLUME PLENUM FOR WAVE GENERATION

(71) Applicant: WHITEWATER WEST INDUSTRIES LTD., Richmond (CA)

(72) Inventors: Clement Ginestet, Saint-Ouen-sur-Seine (FR); Axel Terradillos, Vancouver (CA)

(73) Assignee: WHITEWATER WEST INDUSTRIES LTD., Richmond (CA)

( * ) Notice: Subject to any disclaimer, the term of this patent is extended or adjusted under 35 U.S.C. 154(b) by 118 days.

(21) Appl. No.: 18/535,843

(22) Filed: Dec. 11, 2023

(65) Prior Publication Data

US 2024/0191526 A1    Jun. 13, 2024

Related U.S. Application Data

(60) Provisional application No. 63/386,863, filed on Dec. 9, 2022.

(51) Int. Cl.
*E04H 4/00*      (2006.01)
*G01R 21/00*    (2006.01)

(52) U.S. Cl.
CPC ........... *E04H 4/0006* (2013.01); *G01R 21/00* (2013.01)

(58) Field of Classification Search
CPC .............................. F16K 1/223; E04H 4/0006
See application file for complete search history.

(56) References Cited

U.S. PATENT DOCUMENTS

| 4,558,474 A | 12/1985 | Bastenhof |
| 4,730,355 A * | 3/1988 | Kreinbihl .............. E04H 4/0006 4/491 |
| 5,226,747 A | 7/1993 | Wang et al. |
| 10,738,492 B1 * | 8/2020 | McFarland ........... E04H 4/0006 |
| 2024/0133198 A1 | 4/2024 | Ginestet et al. |

FOREIGN PATENT DOCUMENTS

| FR | 2564534 A1 | 11/1985 |
| GB | 2149063 A | 6/1985 |
| WO | 2024119283 A1 | 6/2024 |

OTHER PUBLICATIONS

International Search Report and Written Opinion for International Application No. PCT/CA2023/051640, mailed Feb. 14, 2024, 10 Pages.

* cited by examiner

*Primary Examiner* — Lauren A Crane
(74) *Attorney, Agent, or Firm* — Buchalter, a Professional Corporation (57) ABSTRACT

A variable volume plenum for use in a wave pool comprising at least one wave generating chamber in pneumatic communication with a plenum. The plenum is configured to have a variable volume such that when the pressure increases in the plenum, the variable volume plenum will increase in volume, and when pressure drops in the plenum, the variable volume plenum will retract so the fans can stay at maximum efficiency.

8 Claims, 6 Drawing Sheets

VARIABLE VOLUME PLENUM FOR WAVE GENERATION

CROSS REFERENCE TO RELATED APPLICATIONS

This application claims the benefit of U.S. Provisional Patent Application Ser. No. 63/386,863, filed on Dec. 9, 2022, entitled "VARIABLE VOLUME PLENUM FOR WAVE GENERATION," which is incorporated by reference in its entirety.

BACKGROUND OF THE INVENTION

The present invention relates to the field of wave generation for recreational wave pools. More particularly, it relates to a wave generation system in which the plenum is capable of expanding and contracting in order to maximize efficiency of the fans.

BRIEF SUMMARY OF THE INVENTION

Wave generation technology for wave pools typically makes use of centrifugal fans or compressors in the plenum to create waves. However, special care needs to be taken when using this equipment as instabilities can occur. This phenomenon, called "surge" or "stall" is typified by excessive vibrations, premature damage to the equipment and loss of efficiency of the overall system. U.S. patent application Ser. No. 18/490,604, titled "Butterfly Fan Inlet And Chamber Exhaust Valve Controllers For Wave Making System" describes a method to overcome this phenomenon and to maximize the efficiency of each fan (and so the overall system) by exhausting air through caisson exhaust valves based on a power reading of the fans motors. Nevertheless, power is still wasted when exhausting air in these systems.

The invention described herein addresses these problems without exhausting air, or by minimizing the amount of air exhausted, which further increases efficiency of operations. By measuring the power consumed by fans in real time, it is possible to determine the amount that the plenum needs to expand or retract so that the fans always operate at maximum efficiency. It also allows the operator to regulate each fan airflow correctly to avoid instabilities.

As the pressure drops in the plenum (e.g., when waves are created), based on the power reading, the plenum will retract so the fans can stay at maximum efficiency. In effect, the plenum would expand and retract like lungs. Thus a variable volume plenum increases efficiency.

During normal operation of a wave generation chamber, air is vented from the chamber. However, the venting process results in wasted energy. It is an object of this invention to reduce this waste by employing an adjustable plenum. Instead of a static plenum that relies on fans to vent the plenum, the current invention uses an adjustable plenum to maintain pressure. Instead, the volume of the plenum is changed. Thus, the need to vent air can be minimized if not entirely eliminated. The adjustable plenum increases or decreases the volume within the plenum through moveable plenum walls, or by otherwise filling and vacating the plenum with other devices, liquids, gasses, or the like, as will be described herein.

In one aspect the variable volume plenum is comprised of a controllable bladder.

In another aspect the variable volume plenum is comprised of a plenum fitted with a large piston on one or both sides of the plenum.

In another aspect the variable volume plenum is comprised of multiple smaller moveable wall portions with a piston mounted on top of the plenum.

In another aspect the variable volume plenum is comprised of a bigger plenum which is filled with water to control its volume (as water is incompressible).

In another aspect the variable volume plenum is comprised of a bladder in the plenum which is filled with a gas or a liquid.

These and other embodiments of the present invention will become apparent to those skilled in the art from a consideration of the following detailed description taken in combination with the accompanying drawings and by the elements, features, and combinations particularly pointed out in the claims.

BRIEF DESCRIPTION OF THE DRAWINGS

Exemplary embodiments will be described and explained with additional specifics and details through the use of the accompanying drawings.

DETAILED DESCRIPTION OF THE INVENTION

Wave generation technology for wave pools typically makes use of centrifugal fans or compressors in the plenum to create waves. However, special care needs to be taken when using this equipment as various problems can occur that are potentially damaging to the equipment, and can lead to increased operation expenses.

Figure 1:
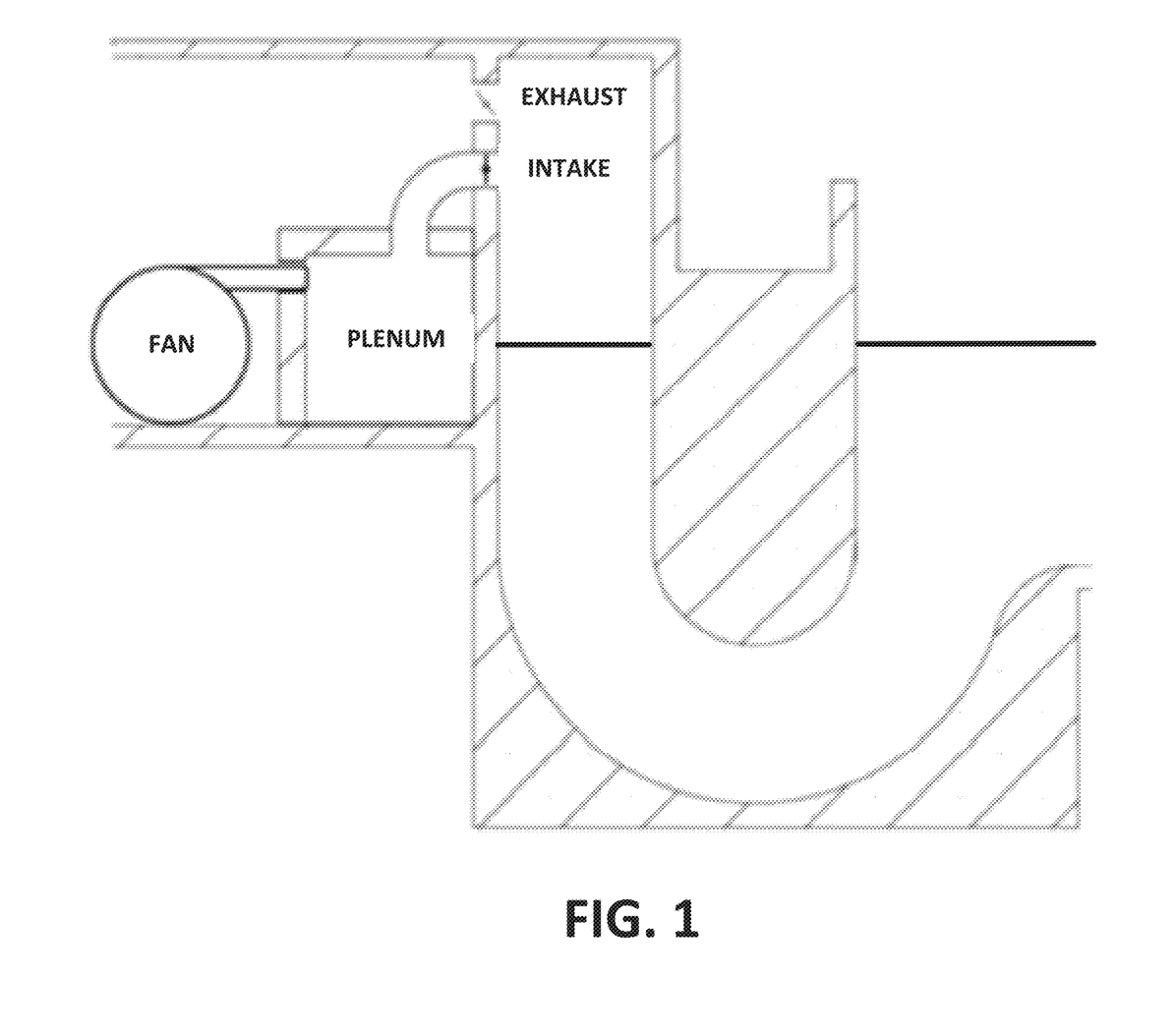
FIG. 1 illustrates a side-view of a wave generation chamber, as is known in the prior art, in which the present invention may be incorporated.

One problem that can occur in wave generation systems is fan surge or stall. In most pneumatic systems intended for wave generation, a set of air fans blows in a common plenum to build up the air pressure. One such typical wave generation system is depicted in FIG. 1, which illustrates a side view of a typical wave generation chamber for a wave pool. When the pressure in the plenum becomes too great for the fan to blow air in, the air begins to escape from the plenum through the fan in the opposite direction (i.e., reverse flow). As a result, one or more fans in the system blow backwards and make the system less efficient because air is being vented from the plenum. This phenomenon not only creates instabilities because it is has large oscillations (large pressure fluctuations in the plenum), but it can also damage the fans because the forces applied to the rotor are cyclically reversed. These instabilities can occur not only when trying to maintain a target pressure in the plenum, but also when ramping up or freewheeling the fans when turned off.

A second associated problem is fan efficiency drop. A fan curve, such as that shown in FIGS. 12A and 12B of U.S. patent application Ser. No. 18/490,604, can provide the relationship between the power consumed by the fan and the air flow/pressure it creates at the outlet. When the fan is operating in surge, efficiency can drop to zero or even negative efficiency, as air is flowing back in the opposite direction while some power is still drawn by the motor. For the whole pneumatic system, this means that the efficiency is generally lower, as the other fans in operation must blow more air to reach a given pressure in the plenum, thereby consuming more power. As efficiency of each fan cannot be controlled individually, the system finds a state of equilibrium between some fans running in surge and others in normal operation.

The fan curves are parabolic. Each fan has a maximum pressure at which the fan can still deliver air flow. When the fan reaches or exceeds the maximum, it will begin to bleed flow, which causes oscillation between forward and reverse flow—phenomena sometimes called surge (reverse flow) or stall (flow is blocked or only slightly reversed). Fan surge and stall has deleterious effects on fan efficiency and longevity.

Comparing fan efficiency to pressure shows that peak efficiency occurs close to maximum pressure. That is, the closer the system is to maximum pressure, the bigger the wave produced, and the greater the efficiency of the system in terms of mechanical power used A third associated problem is energy loss during air exhaust. Existing solutions include exhausting or bleeding air to control fans, but this wastes energy in the process. For example, one prior art implementation involves using a vent valve on the plenum that opens for a fixed duration when the pressure recorded by a pressure sensor in the plenum exceed a threshold. This is described in U.S. Pat. No. 10,738,492 B1 to McFarland. Similar solutions exist in compressor engineering called surge control method which is similar to the McFarland method (vent or blow off valve with a pressure sensors and/or others). The prior art methods are all using pressure sensors in the plenum and are venting air trough a vent valves connected to the plenum.

Another prior art solution involves detecting when a process compression stage is approaching a surge state and subsequently taking action to reverse the movement of the operating point towards the surge line. This decreases the plenum pressure and increases the flow through the compressor, resulting in stable working conditions. It is normally achieved by opening a control valve in a recycle line, returning the discharge gas to the inlet of the compressor via a suction cooler. The resulting increase in compressor inlet volume flow moves the operating point away from surge.

However, each of these prior attempts has its own drawbacks. The prior art uses vent valves connected to the plenum, about one per fan, which results in added equipment and controls. Several pressure sensors are connected to the plenum and are measuring pressure in the plenum. When the measured pressure is above a preset value the valves open (all together or individually) for a preset time, after this time the pressure is measured again and if the value is below the preset value, the valves close, or open again for a preset time. This process is not optimally designed and it is highly probable that instabilities will still occur or too much air will be vented, thereby wasting energy. The controls in may also be fairly unstable.

Off the shelf solutions are overly complex. Typically this would include numerous sensors to collect data on flow, temperature at inlet/outlet, and pressure at inlet/outlet. These solutions are designed for compressors, not fans.

For both of these solutions, using pressure as the measured value to control the system may not be precise enough. Indeed, near the instability point (surge line) which is near the maximum efficiency point, the pressure differential between these two points is really small, making it difficult for the controller to capture this difference and react quickly enough.

The invention described herein uses a variable volume plenum—that is, an expandable or retractable plenum. During normal operation of a wave generation chamber, air is vented from the chamber. However, the venting process results in wasted energy. It is an object of this invention to reduce this waste by employing an adjustable plenum. Instead of a static plenum that relies on fans to vent the plenum, the current invention uses an adjustable plenum to maintain pressure. Thus, there is no need to vent air. Instead, the volume of the plenum is changed. The adjustable plenum increases or decreases the volume within the plenum through moveable plenum walls, or by otherwise filling and vacating the plenum with other devices, liquids, gasses, or the like, as will be described herein.

Instead of controlling the exhaust valve angle, we control the volume of the plenum. Instead of exhausting air the plenum will expand, thereby storing energy in the system instead of wasting energy. By measuring the power consumed by the fans in real time, it is possible to determine the amount of volume the plenum needs to expand so that the fans always operate at maximum efficiency. It also allows the system to regulate each fan airflow correctly to avoid instabilities. When the pressure drops in the plenum (when waves are made), as evidenced by the power reading, the plenum will retract so the fans can stay at maximum efficiency. In this aspect, the plenum can expand and retract like lungs.

A wave generation system according to an aspect of the invention is shown in FIG. 1. The fans blow in a common plenum which feeds independent wave generation caissons through an intake valve, such as the butterfly valve shown in FIG. 1. Each system is equipped with an exhaust valve to evacuate the air from the chamber and let the water rise under the gravity to create a wave.

A power sensor (Variable Frequency Drives or VFD) measures in real time the power drawn by each fan, while two other sets of sensors measure temperature in the plenum and pressure in the chambers. For a given fan rotating speed and a given air density (calculated with a temperature and humidity sensor located in the mechanical), the fan curve gives the relationship between the power consumed and the air flow at the fan outlet. Next, the controller (based on equations derived from the ideal gas law and a PID feedback loop) calculate a target volume for the plenum to reach (expand or retract). In each embodiment below, the controller will control the mechanism by which the plenum volume is adjusted.

Figure 2:
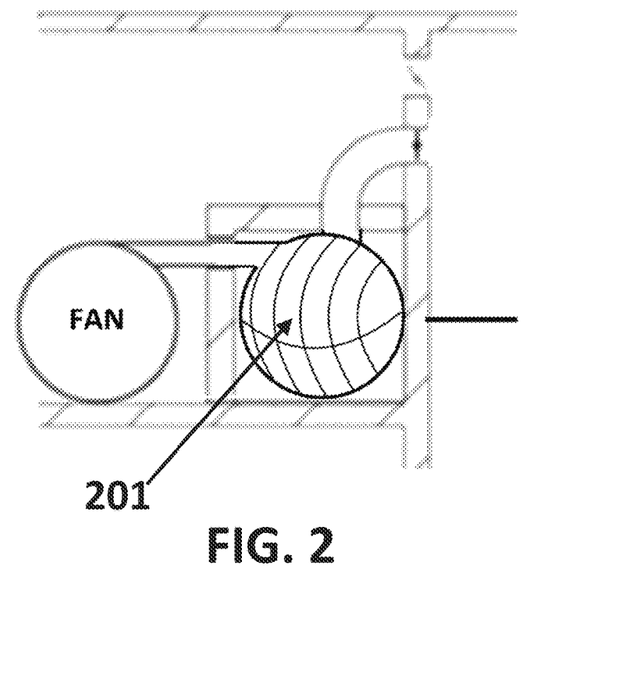
FIG. 2 illustrates a controllable bladder according to one aspect of the invention.

The invention contemplates several ways to change the plenum volume. FIG. 2 illustrates a detail of the fan and plenum portion of the wave generating device depicted in FIG. 1, depicting one embodiment of the invention. In one embodiment, the variable volume plenum is comprised of a controllable, expandable and contractible bladder 201. As depicted in FIG. 2, the bladder may be incorporated into an existing plenum (acting as a liner), and in fluid communication with the fan and intake valve(s). The bladder 201 may be encompassed with cords, wires, or similar means for restricting the expansion of the bladder 201, or for retracting the bladder 201. The cords may be fastened to a reel, pulley, or other device that can pull the cords in to retract the bladder or let out to allow the bladder to expand depending on the mode of operation of the wave generating device. A controller may be provided to control the expansion and retraction of the controllable bladder 201 to maintain the desired volume for maximum efficiency. It will be understood that although the illustration in FIG. 2 the bladder is depicted as spherical, the particular shape of the bladder need not be spherical. Rather, the bladder will preferably be shaped to best fit the needs and shape of the particular facility. Multiple bladders along the length of the bladder may also be employed in certain circumstances.

Figure 3:
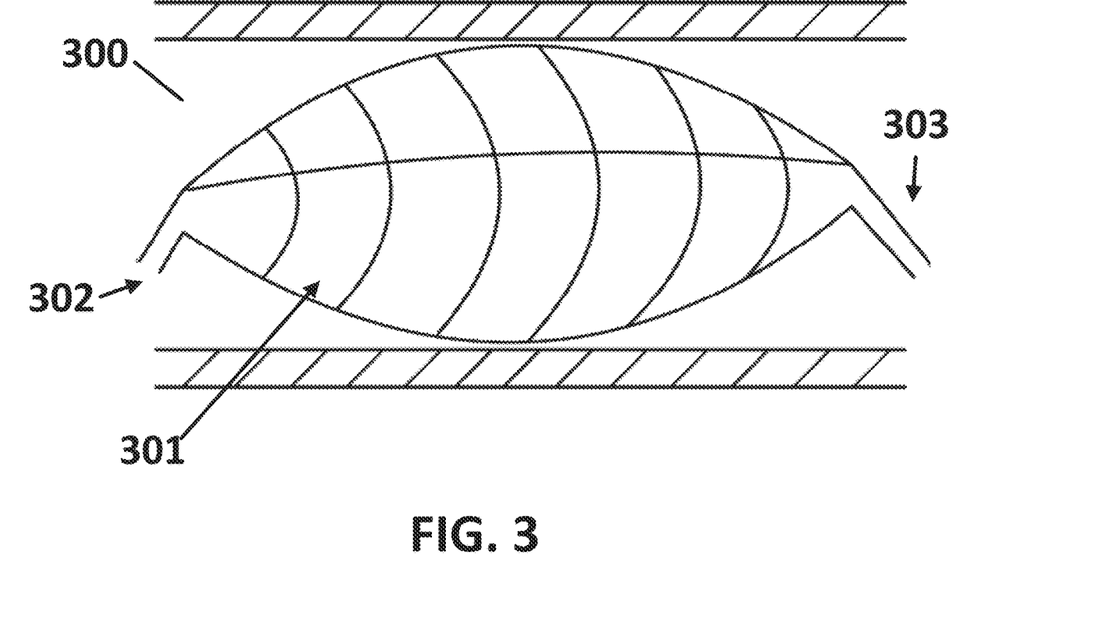
FIG. 3 illustrates a controllable bladder according to one aspect of the invention.

FIG. 3 depicts a side view of a plenum 300, and depicts an alternative embodiment of a controllable bladder 301. In this embodiment, the controllable bladder may be shaped to occupy the entire plenum 300. The bladder 301 is connected to the fan via a conduit 302 and is connected to the intake valves via a second conduit 303.

Figure 4:
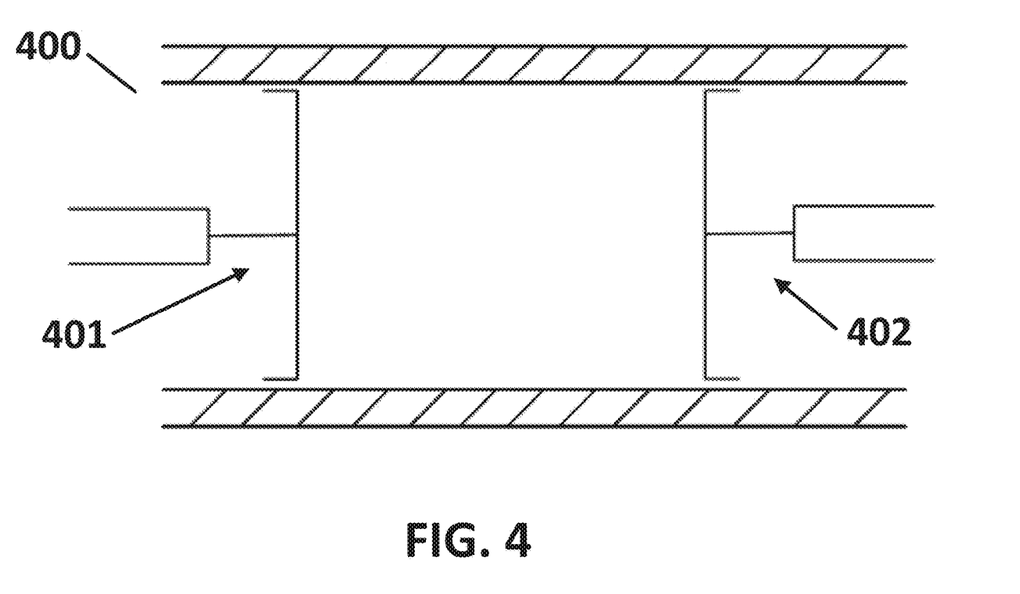
FIG. 4 illustrates a plenum with controllable pistons according to one aspect of the invention.

In another aspect the variable volume plenum is comprised of a plenum 400 fitted with moveable walls attached to a large piston 401, 402 on both sides of the plenum, as depicted in FIG. 4. Alternatively, the plenum may be fitted with a single moveable wall actuated by a piston, or more than two walls may be moveable and fitted with pistons. A controller controls the movement of the piston to maintain the desired volume for maximum efficiency.

Figure 5:
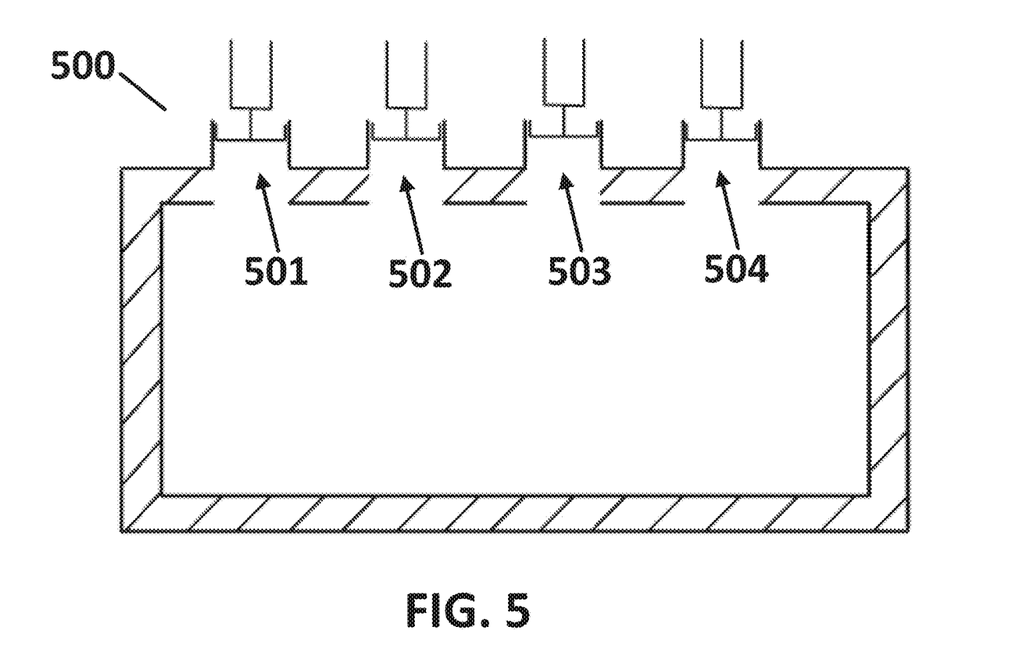
FIG. 5 illustrates a plenum with multiple controllable pistons according to one aspect of the invention.

In another embodiment, the variable volume plenum is comprised of a plenum 500 fitted with moveable wall portions 501, 502, 503, 504 situated along one wall of the plenum. In a preferred embodiment, the moveable wall portions will be located on the top wall of the plenum, with the pistons mounted above the wall. In this manner, multiple moveable wall portions may be located along the entire length of the plenum so that the plenum can be pressurized at different rates as needed. For example, if pressure in a particular chamber is causing surge, the moveable wall portion in that portion of the plenum closest to the chamber can be actuated to counteract the surge. Alternatively, the moveable wall portions may be located along a back wall to accomplish a similar effect with a similar benefit.

Figure 6:
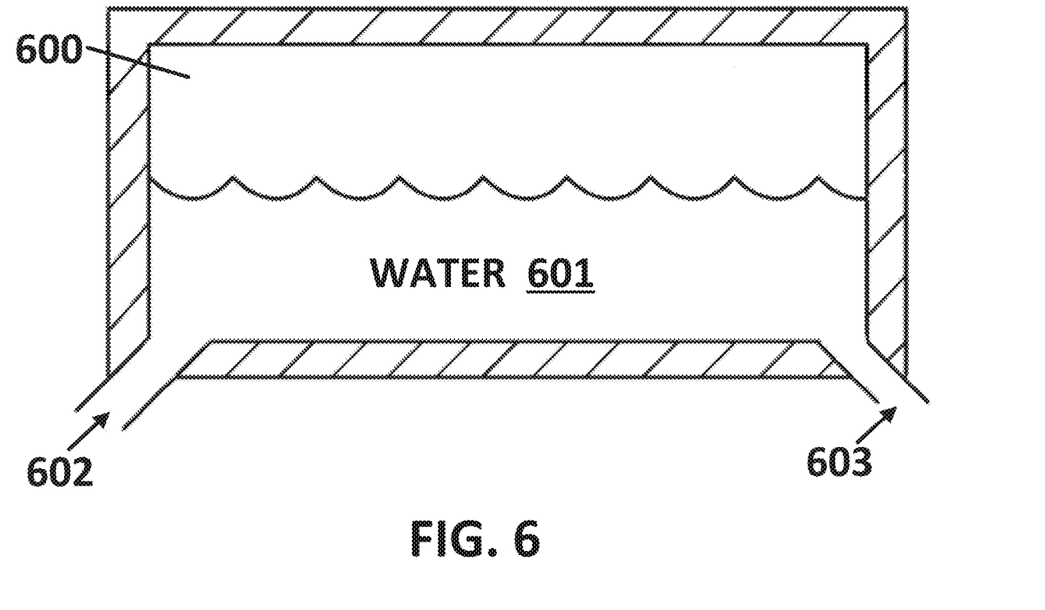
FIG. 6 illustrates a water-filled plenum according to one aspect of the invention.

FIG. 6 depicts another embodiment in which the variable volume plenum is comprised of a large plenum 600 filled with water 601 to control the volume of the plenum. Because water is incompressible, water may be added to (or removed from) the plenum to decrease (or increase) the available volume in the plenum that may be occupied by air. The water may be pumped into and out of the plenum via conduits 602, 603.

Figure 7:
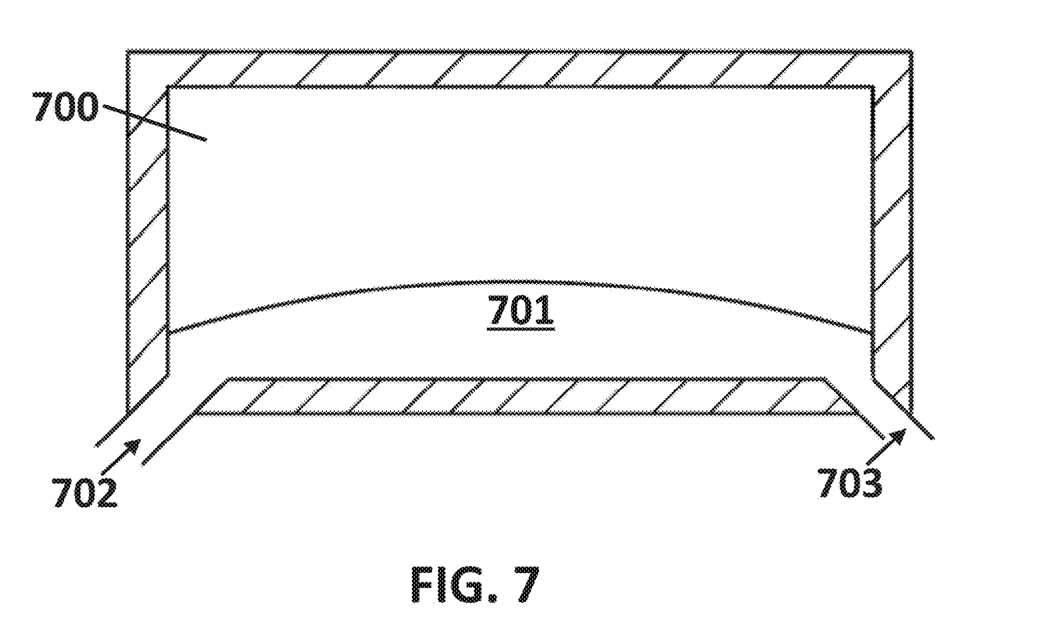
FIG. 7 illustrates a plenum with a bladder according to one aspect of the invention.

FIG. 7 depicts another embodiment of a controllable bladder as described in connection with FIGS. 2 and 3. In the embodiment in FIG. 7, the bladder 701 may comprise only a flexible top layer that divides the plenum 700 into two portions. The bladder 701 may then be inflated or filled with air, another gas, or a liquid via one or more conduits 702, 703 to occupy a greater volume of the plenum.

Although not shown here, in those embodiments in which a gas or liquid is used to alter the volume, it is contemplated that the controller will control a pump and/or reservoir located near the conduits to supply the gas or liquid for the variable volume plenum. It is also contemplated that the controller may control valves located in or near the conduits to control the ingress and egress of the gas or liquid.

Figure 8:
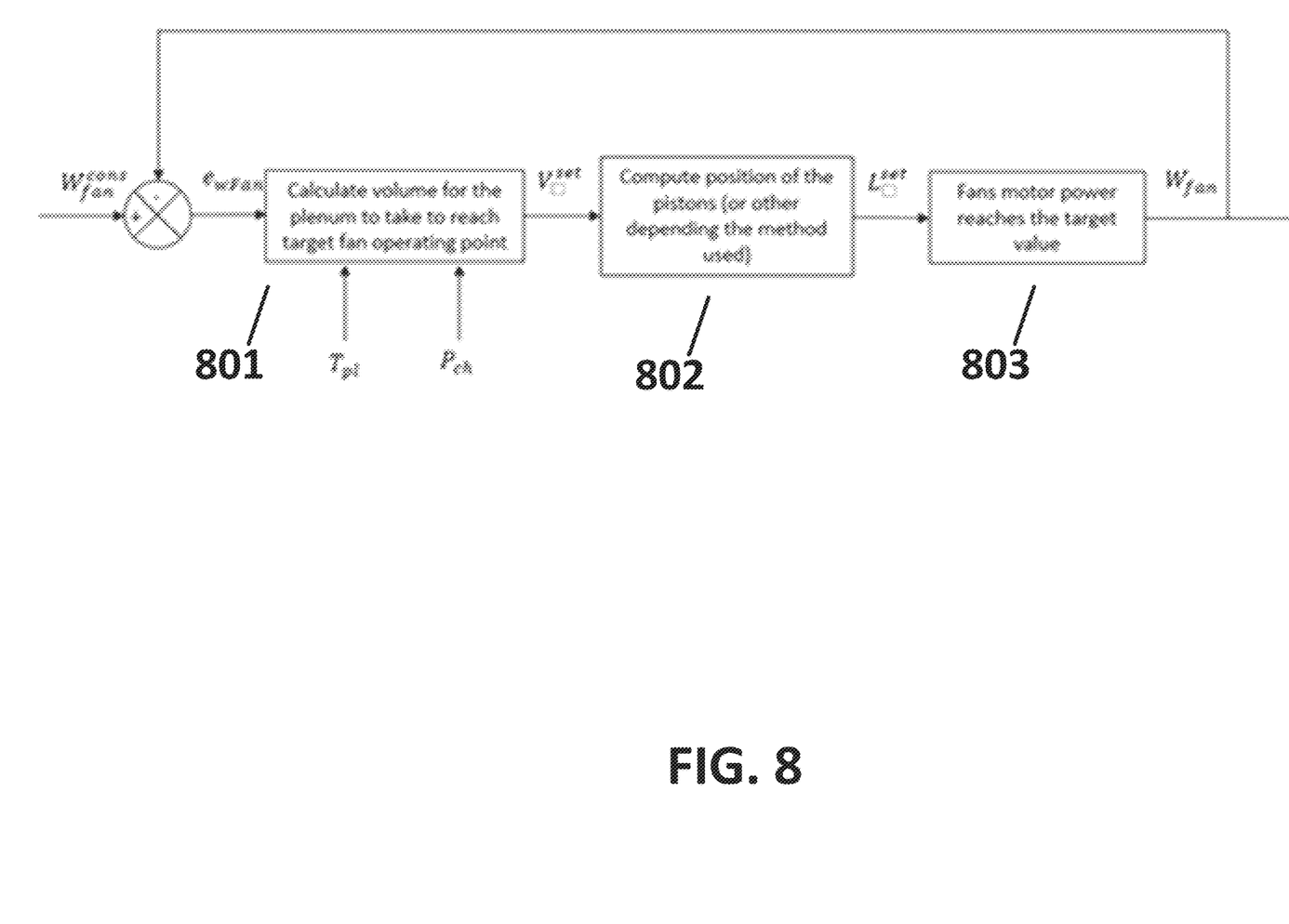
FIG. 8 is a block diagram explaining the one method of calculating the volume of the variable volume plenum.

FIG. 8 is a block diagram explaining one method of calculating the volume of the variable volume plenum. At a first step 801, the system calculates the volume for the plenum to take to reach the target fan operating point. Inputs for this step include the temperature of the plenum $T_{pl}$ and pressure of the chamber $P_{ch}$. At the next step 802, the system calculates the position of the pistons. In other embodiments, the system would calculate the volume of water, volume of bladder, etc., as appropriate. In the final step 803, the fan motor power reaches the target value.

Figure 9:
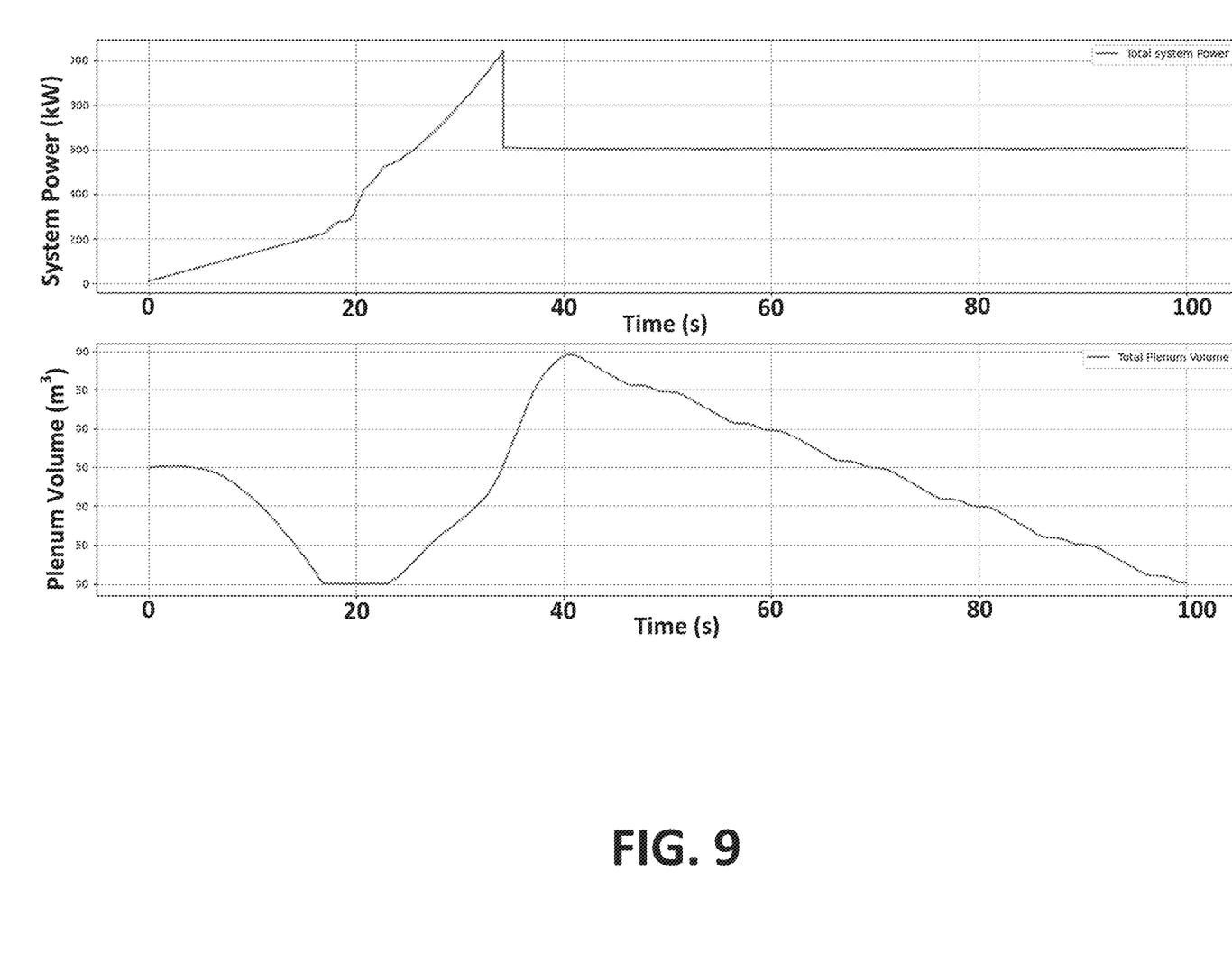
FIG. 9 illustrates model power output and volume curves during wave generation without fan instabilities and with stable operation.

FIG. 9 shows two graphs of a single simulation, showing power drawn by the fans (top) and the variation of the plenum volume (bottom) as a function of time. The power curve shows that up to t=40 s, the fans are ramping up (exhibiting a spike in power due to the ramp up of the fan) during that phase the plenum is expanding to avoid instability and it is storing energy. By increasing volume, the fans are always at maximum efficiency without instabilities. After the spike, the wave generation starts and the plenum volume gradually decreases while the power remains constant (at best efficiency). When the wave generation starts the volume in the plenum decreases to keep sufficient pressure in the plenum to create the desired size of waves. These models confirm that controlling the volume of the variable volume plenum accomplishes the goals of increased efficiency and reduced potential for damage to the fan systems.

The invention demonstrates at least two key benefits. First, by starting with a small volume, one can reduce the time required to fill the plenum (and the power consumption associated during this phase). Second, by increasing the volume during the startup phase, the plenum can store energy which can be restored to the system during wave generation. The same wave can be created with fewer fans than with other systems.

Although it is possible to control the volume using pressure sensors, it is preferred to use flow sensors located at the inlet of each fan.

An alternative to the variable volume plenum would be to have another (smaller) plenum where the pressure can be controlled inside. Instead of the plenum expanding this embodiment would take air from the main plenum and pressurized (more than it actually is) in the other plenum. Although this might also technically be achievable by controlling the temperature in the plenum, the temperature control method is less feasible and more inefficient in terms of energy usage.

The invention described herein provides at least the following advantages over the prior art: avoid fan instabilities; optimize fan set efficiency (at least +25% compared to uncontrolled system); deliver bigger/more consistent waves due to elimination of airflow oscillations, allowing fan performance to be fully exploited during wave generation process; increase fan longevity by removing unwanted loads; greater control to precisely feed the pneumatic caissons with stable airflow; fans can safely freewheel when no wave are generated; reduce noise generated by the fans; reduce heat generated by the fans; reduced power installed; lower power consumption; and higher overall system efficiency.

While certain embodiments have been provided and described herein, it will be readily apparent to those skilled in the art that such embodiments are provided by way of example only. It should be understood that various alternatives to the embodiments described herein may be employed, and are part of the invention described herein.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above descriptions of illustrated embodiments of the system, methods, or devices are not intended to be exhaustive or to be limited to the precise form disclosed. While specific embodiments of, and examples for, the system, methods, or devices are described herein for illustrative purposes, various equivalent modifications are possible within the scope of the system, methods, or devices, as those skilled in the relevant art will recognize. The teachings of the system, methods, or devices provided herein can be applied to other processing systems, methods, or devices, not only for the systems, methods, or devices described.

The elements and acts of the various embodiments described can be combined to provide further embodiments. These and other changes can be made to the system in light of the above detailed description.

In general, in the following claims, the terms used should not be construed to limit the system, methods, or devices to the specific embodiments disclosed in the specification and the claims, but should be construed to include all processing systems that operate under the claims. Accordingly, the system, methods, and devices are not limited by the disclosure, but instead the scope of the system, methods, or devices are to be determined entirely by the claims.

While certain aspects of the system, methods, or devices are presented below in certain claim forms, the inventors contemplate the various aspects of the system, methods, or devices in any number of claim forms. Accordingly, the inventors reserve the right to add additional claims after filing the application to pursue such additional claim forms for other aspects of the system, methods, or devices.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A system for generating waves, comprising
one or more wave generating chambers that releases water into a pool;
a plenum pneumatically connected to each of the one or more chambers, wherein the plenum is configured to have a variable volume;
a plurality of fans connected to the plenum and adapted to pressurize the plenum;
a plurality of sensors connected to the fans and adapted to measure the power output of the fans;
a controller capable of measuring fan power output from a sensor in the plurality of sensors, and wherein the controller is capable of increasing the size of the variable volume plenum when fan power output falls below a preset point.

2. The system of claim 1, wherein the plenum comprises a controllable bladder.

3. The system of claim 2, wherein the controllable bladder is filled with a gas.

4. The system of claim 2, wherein the controllable bladder is filled with a liquid.

5. The system of claim 1, wherein the variable volume plenum comprises one or more pistons adapted to move at least one wall of the plenum.

6. The system of claim 1, wherein the variable volume plenum comprises a plurality of moveable wall portions on an upper surface of the plenum, each moveable wall portion piston mounted with a piston above the upper surface of the plenum.

7. The system of claim 1, wherein the variable volume plenum comprises a water-filled plenum adapted to add or remove water from the plenum.

8. The system of claim 1, wherein the variable volume plenum comprises an inflatable bladder within the plenum, wherein when the bladder is inflated the volume in the plenum is decreased.

* * * * *